(12) United States Patent
Chang

(10) Patent No.: US 6,365,922 B1
(45) Date of Patent: Apr. 2, 2002

(54) FOCUSING CUP FOR SURFACE MOUNT OPTOELECTRONIC DIODE PACKAGE

(75) Inventor: Bill Chang, Hsin-Chu (TW)

(73) Assignee: Harvatek Corp., Hsin-Chu (TW)

( * ) Notice: Subject to any disclaimer, the term of this patent is extended or adjusted under 35 U.S.C. 154(b) by 0 days.

(21) Appl. No.: 09/713,405

(22) Filed: Nov. 16, 2000

(51) Int. Cl.⁷ ............................................... H01L 33/00
(52) U.S. Cl. ............................ 257/98; 257/99; 257/676
(58) Field of Search ........................... 257/98, 99, 100, 257/433, 434, 676, 680, 81

(56) References Cited

U.S. PATENT DOCUMENTS 5,936,264 A * 8/1999 Ishinaga ........................ 257/99
6,069,440 A * 5/2000 Shimizu et al. ............... 313/486
6,093,940 A * 7/2000 Ishinaga et al. ................ 257/99
6,274,890 B1 * 8/2001 Oshio et al. .................... 257/98
6,274,924 B1 * 8/2001 Carey et al. .................. 257/676

FOREIGN PATENT DOCUMENTS

JP          2000-252524     *  9/2000

* cited by examiner

Primary Examiner—Sara Crane
(74) Attorney, Agent, or Firm—H. C. Lin Patent Agent

(57) ABSTRACT

A plastic focusing cup is directly mounted on the bottom metallic contact plates for surface mounting of an optoelectric diode package. The focusing cup and the metallic contacts are held together by providing through holes in the metallic plates and channels at the bottom surface of the metallic plates for the glue from the focusing cup to flow down from the through holes and spread along the channels

6 Claims, 9 Drawing Sheets

FOCUSING CUP FOR SURFACE MOUNT OPTOELECTRONIC DIODE PACKAGE

BACKGROUND OF THE INVENTION

(1) Field of the Invention

This invention relates to surface mount diode package, particularly to the focusing cup of an optoelectric diode.

(2) Brief Description of Related Art

FIG. 1 shows the component parts of a prior art surface mount optoelectric diode package. A plastic focusing cup 13 is used to focus the light emitted from an optoelectric diode (not shown) placed inside the focusing cup. The focusing cup has a flat bottom 132 for mounting the diode and is glued to two metallic plates 11 and 12, separated by a gap 15. The two metallic plates 11, 12 are connected to two electrodes of the optoelectric diode and are mounted over a pedestal 14 with a flange 141. There are two through holes 111 and 121 in the metallic plates 11 and 12, respectively, for the glue of the focusing cup 13 to feed through in adhering the two metallic plates 11, 12 to a plastic pedestal 14. The pedestal 14 has two overhanging flanges 141. The metallic plates 11 and 12 are then folded around the flanges 141 as shown in FIG. 2 to form the contacts 112 and 122 of the surface mount package as shown in FIG. 2.

The pedestal 14 makes the overall cup structure tall and occupies space. For miniaturization and cost reduction, it is desirable to reduce the height of the diode package.

SUMMARY OF THE INVENTION

An object of this invention is to miniaturize a surface mount optoelectric diode package. Another object of this invention is to reduce the cost of manufacturing such a diode.

These objects are achieved by mounting the focusing cup directly on the bottom metallic contact plates of the surface mount diode package without the use of the pedestal. The metallic contact plates and the focusing cup are held together by providing through holes in the metallic contact plates and channels at the bottom surface of the metallic contact plates for the plastic material of the focusing cup to flow down the through holes and spread along the channels.

DETAILED DESCRIPTION OF THE INVENTION

Figure 1:
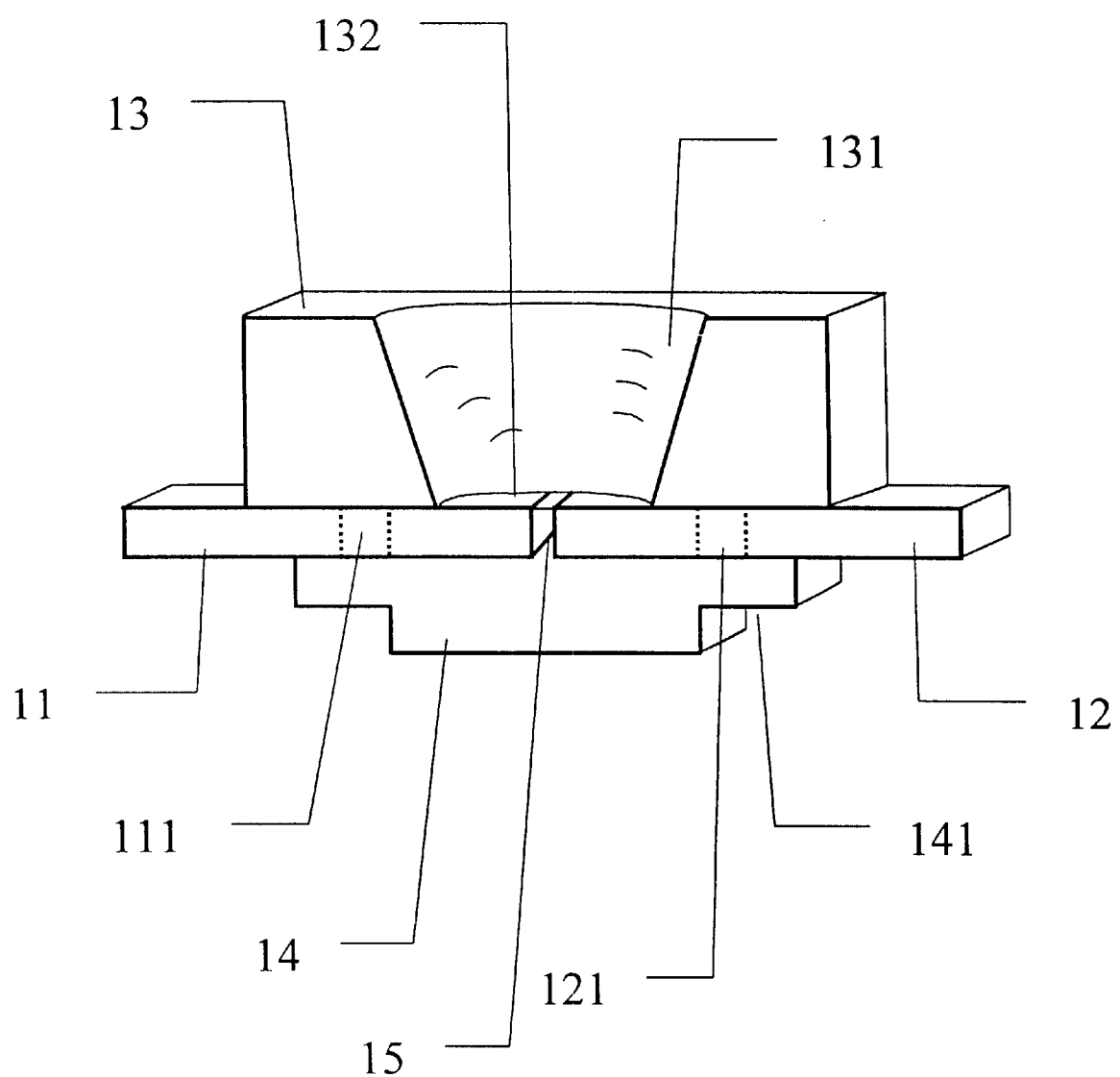
FIG. 1 shows the component parts of a prior art focusing cup in an optoelectric diode.
Figure 2:
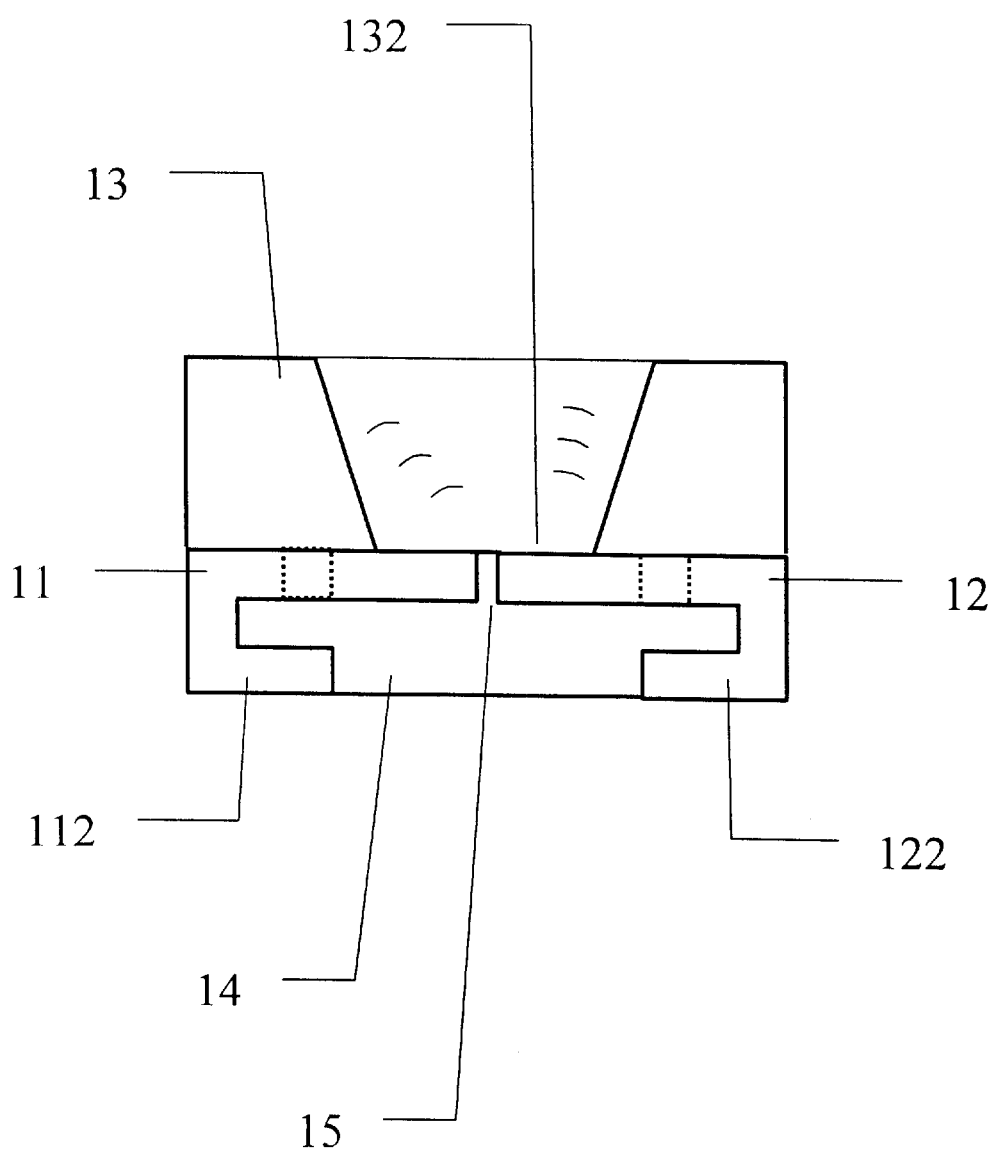
FIG. 2 shows the structure of the prior art focusing cup of the optoelectric diode.
Figure 3:
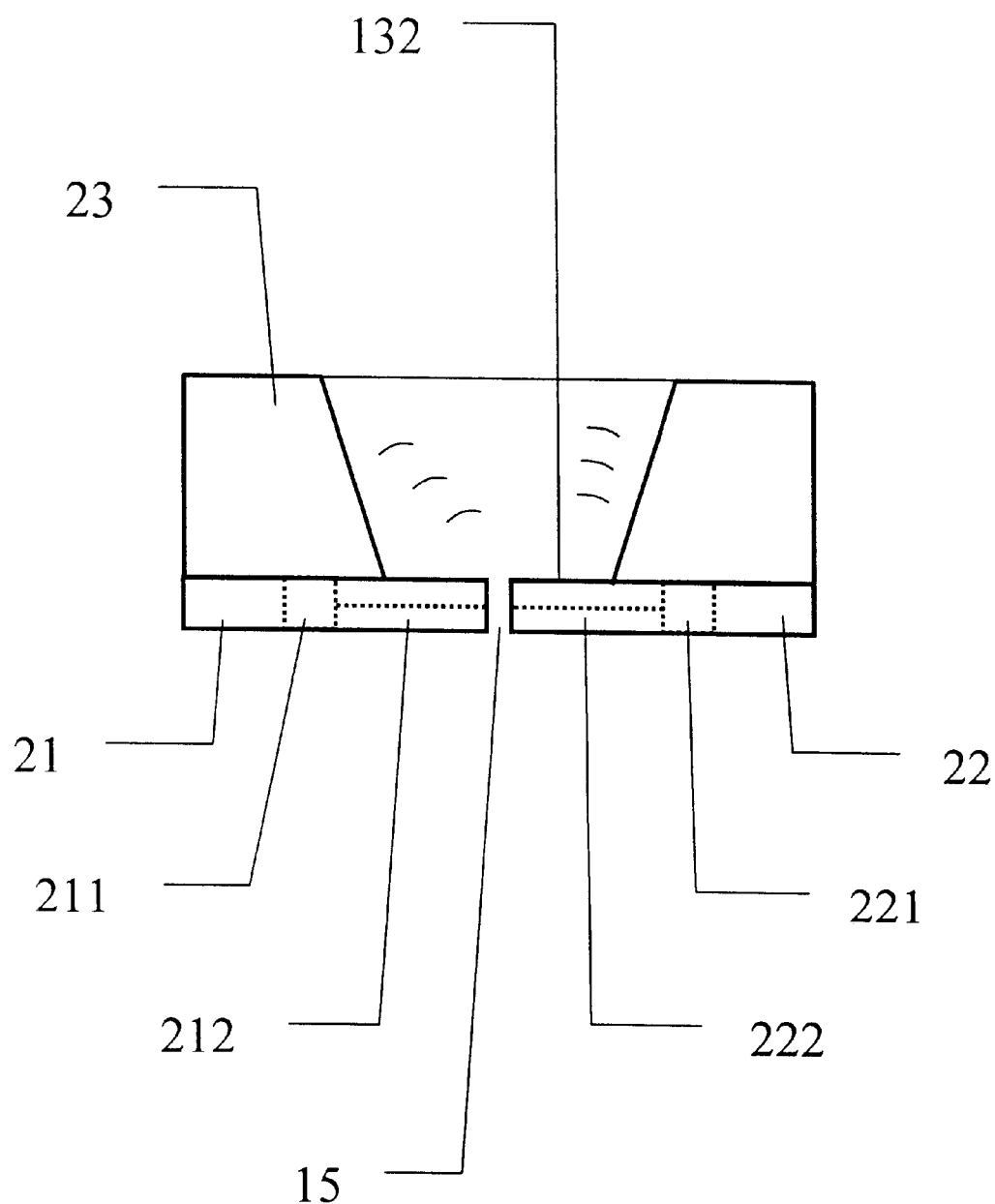
FIG. 3 shows the side view of the basic structure of the focusing cup based on the present invention.

FIG. 3 shows the side view of the present invention. A plastic light focusing cup 23 is glued to the metallic contact plates 21 and 22. The metallic contact plate 21 is directly connected to a first electrode of an optoelectric diode (not shown) mounted over the top surface 132 of the metallic contact plate 21. The metallic contact plate 22 is directly connected to the second electrode of the optical diode over the common top surface 132. The metallic contact plates 21 is glued to the plastic focusing cup by filling a via hole 211 in the metallic contact plate 21 with the glue flowing down from the focusing cup 23, and the metallic contact plate 22 is glued to the plastic focusing cup by filling a via hole 221 with the glue fed from the focusing cup 23. The bottom surface 212 of the metallic plate 21 is for making contact to a motherboard. The bottom surface 222 of the metallic plate 22 is for making contact to another point at the motherboard. The bottom surfaces 212 and 222 are planar for easy connection to the motherboard.

Figure 4:
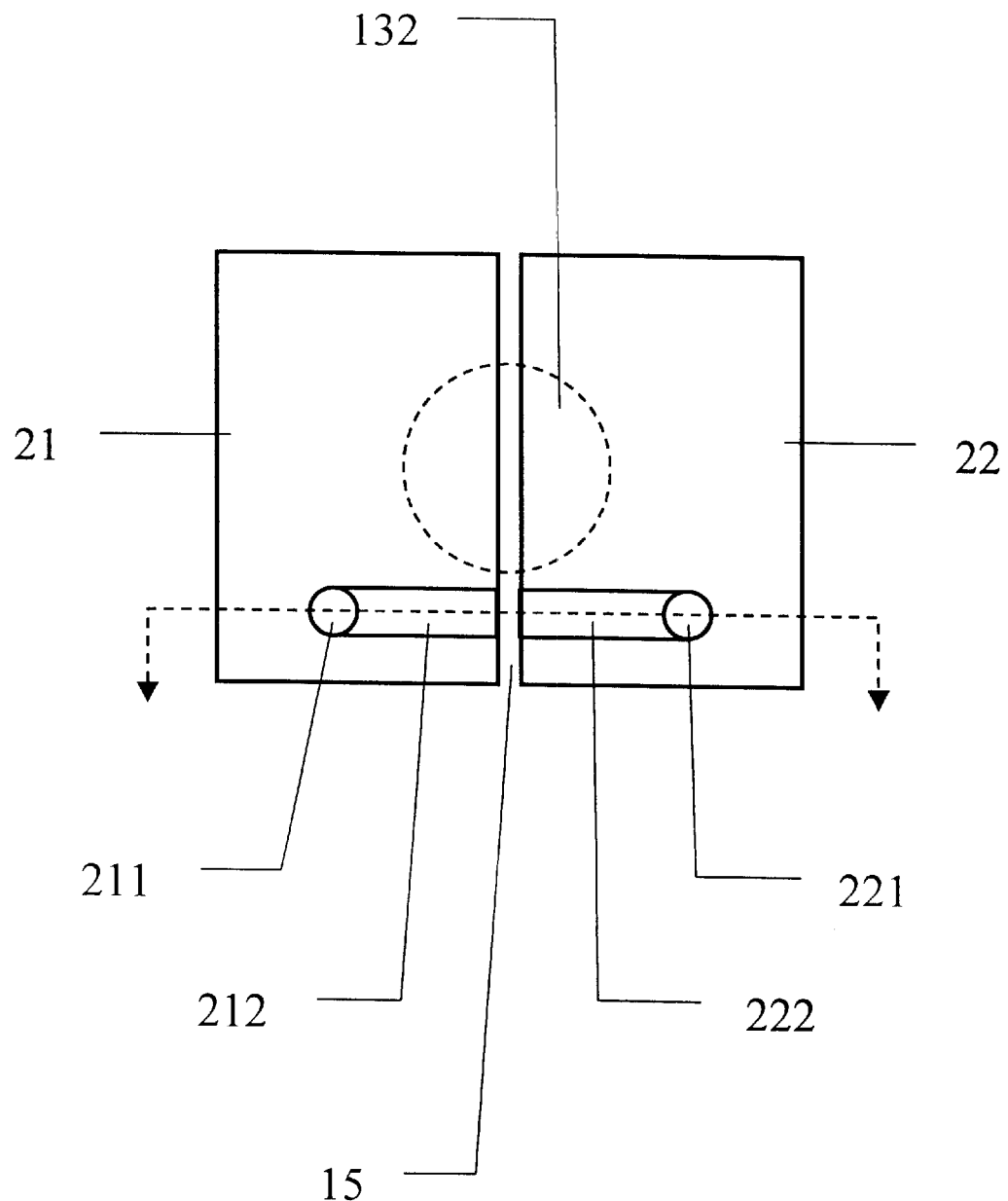
FIG. 4 shows the bottom view of the structure shown in FIG. 3.

FIG. 4 shows the bottom view of the structure shown in FIG. 3. Between the through hole 211 and the gap 15 is a channel 212 where the glue fed from the plastic focusing cup can flow so that the bottom contact plate 21 can be more firmly attached to the focusing cup. Similarly, there is a channel between the through hole 221 in the metallic plate 22 and the gap 15. The bottom 132 of the focusing cup is shown as a dotted circle.

Figure 5:
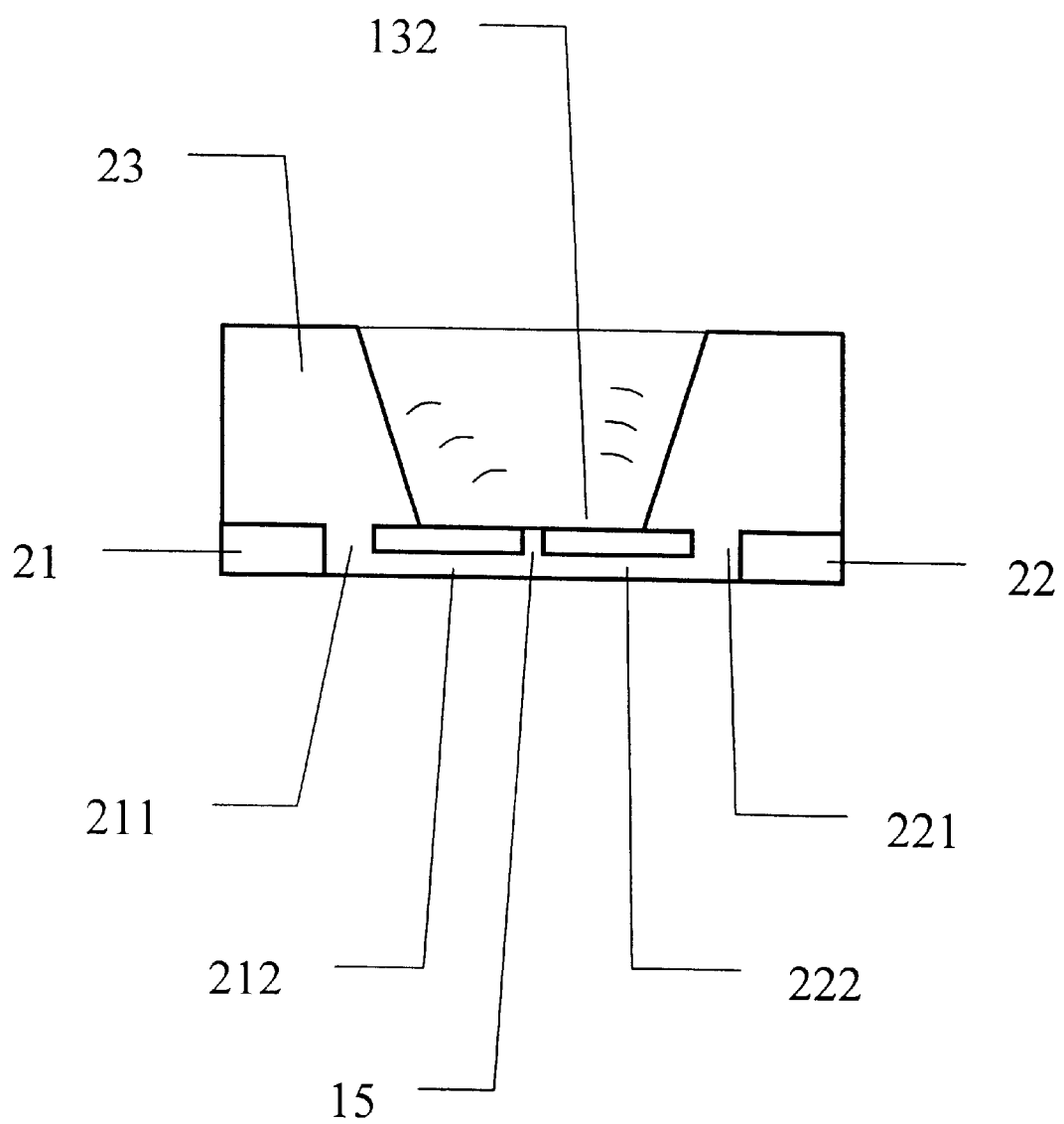
FIG. 5 shows the cross section view of FIG. 4.

FIG. 5 shows a cross section view of FIG. 4 along the dotted section line. The figure shows how the glue from the cup 23 can flow through the through-hole 211 to fill the groove 212 and to meet the glue flowing through the through-hole 221 and groove 222.

Figure 6:
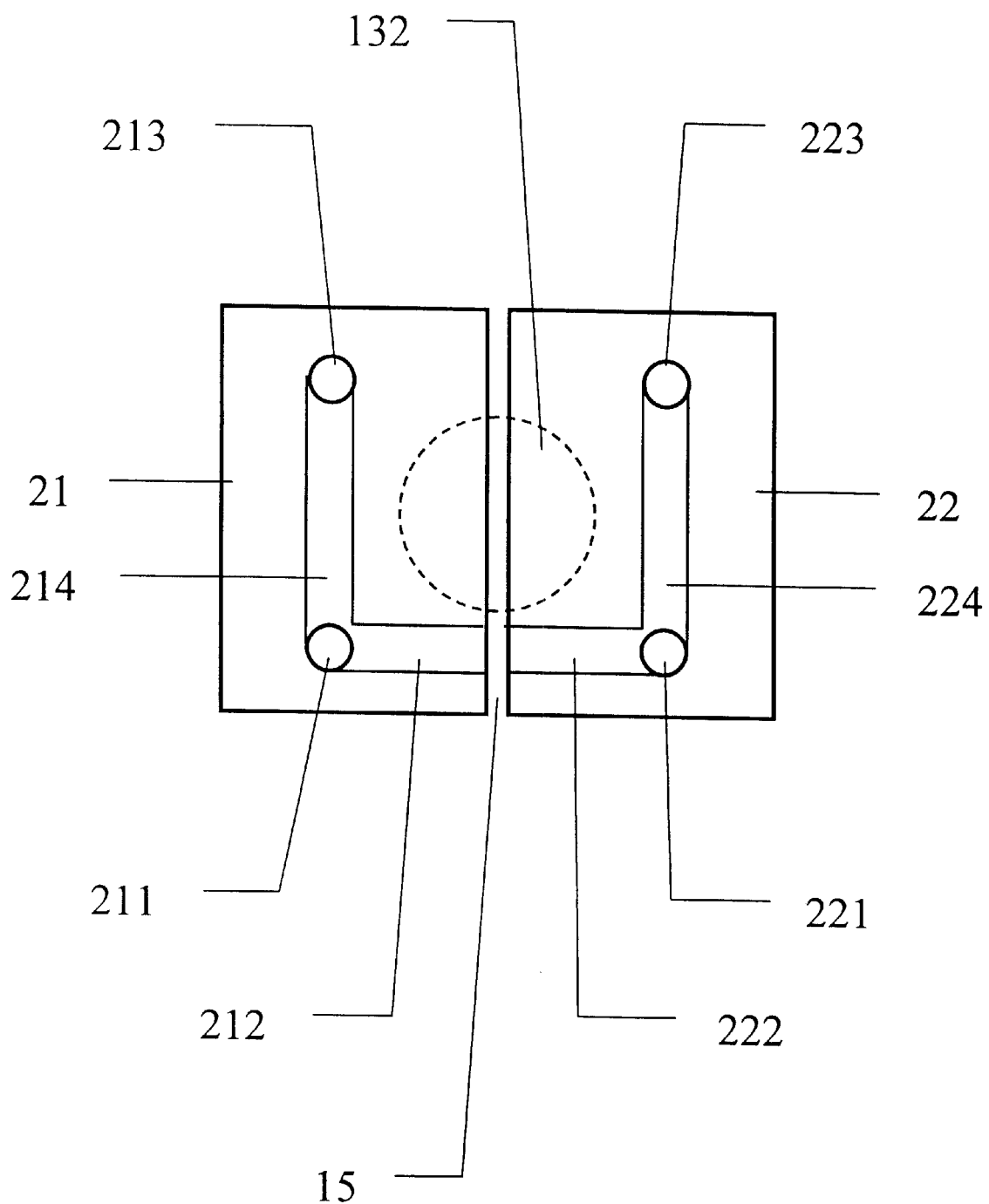
FIG. 6 shows a second embodiment of the bottom view of the structure shown in FIG. 3.

FIG. 6 shows a second embodiment of the bottom view of the structure shown in FIG. 3. In addition to the through holes 211 and 221 shown in FIG. 4, there are two more through holes 213, 223 and two more channels 214, 224. These channels serve the same function as the channels 212, 222 and strengthen the adhesion between the focusing cup and the metallic contacts 21, 22. The bottom 132 of the focusing cup is shown as dotted circle.

Figure 7:
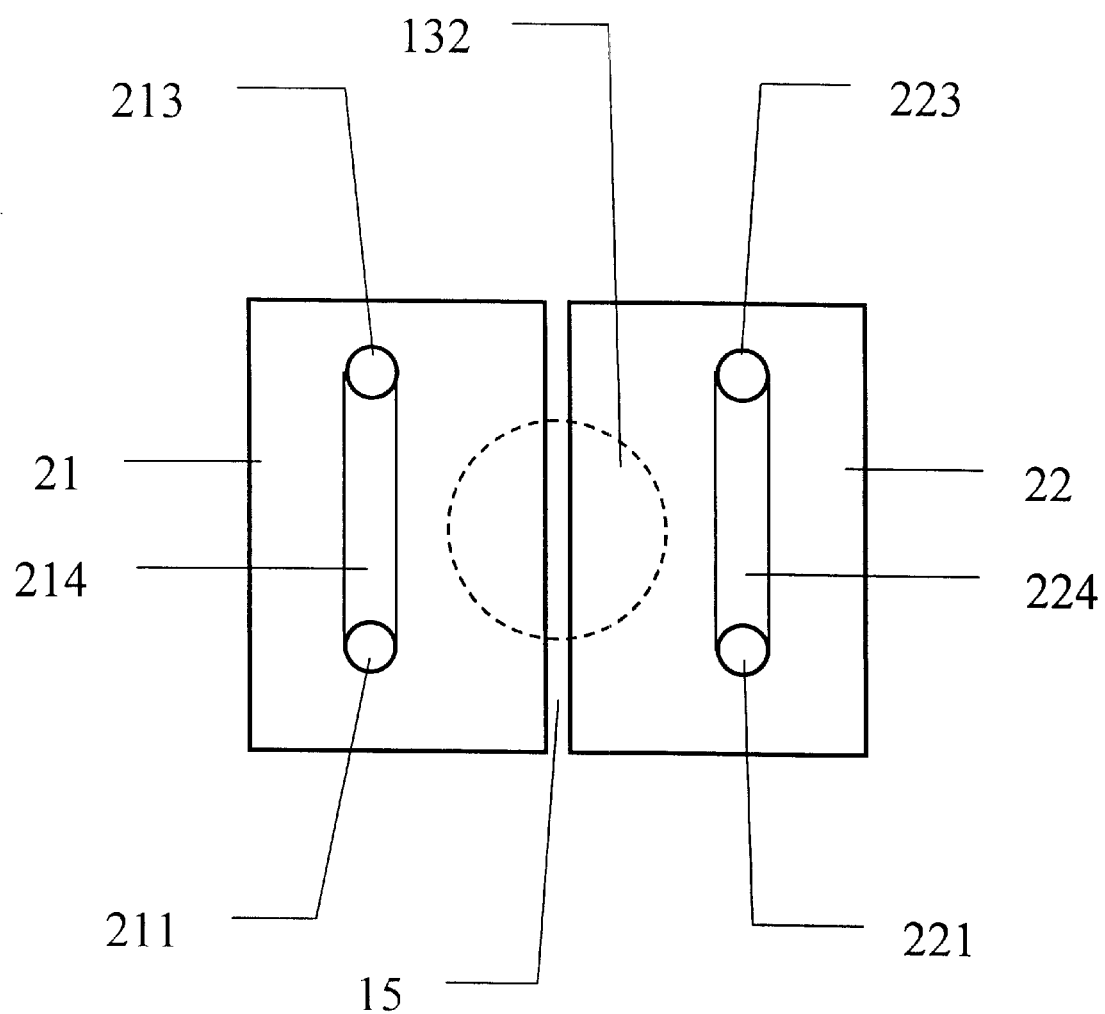
FIG. 7 shows a third embodiment of the bottom view of the structure shown in FIG. 3.

FIG. 7 shows a third embodiment of the bottom view of the structure shown in FIG. 3. Here, there are two through holes 211, 213 for the metallic contact plate 21 and a channel 214 connecting these two through holes. Similarly, there are two through holes 221, 223 for the metallic contact plate 22, and a channel 224 connecting these two through holes.

Figure 8:
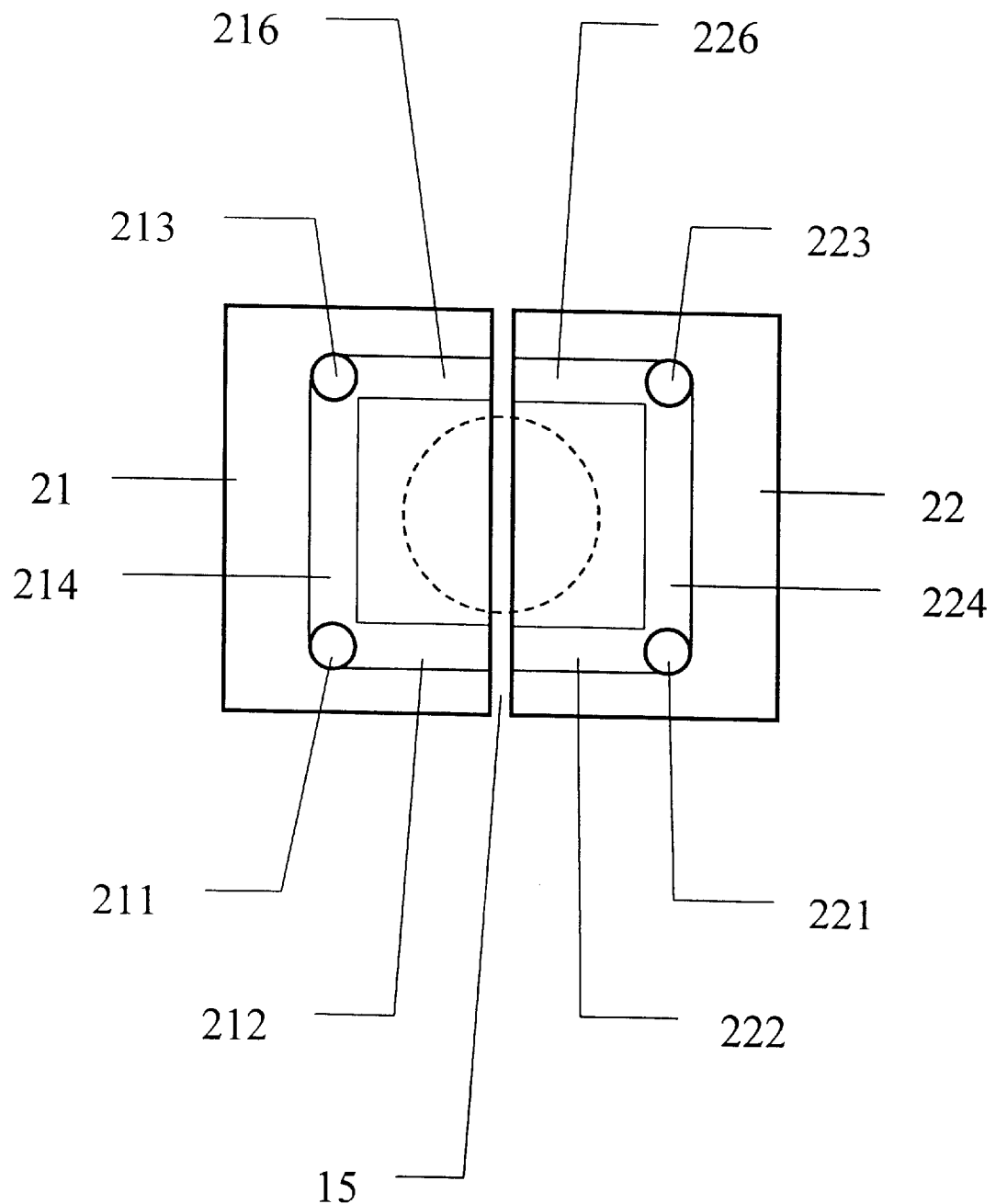
FIG. 8 shows a fourth embodiment of the bottom view of the structure shown in FIG. 3.

FIG. 8. shows the bottom view of a fourth version of the structure. In addition to the two vertical channels 214, 224 shown in FIG. 7, there are two horizontal channels 212, 216 in the metallic contact plate 21, and there are two horizontal channels 222, 226. These additional channels further strengthen the adhesion between the focusing cup and the metallic contact plates.

Figure 9:
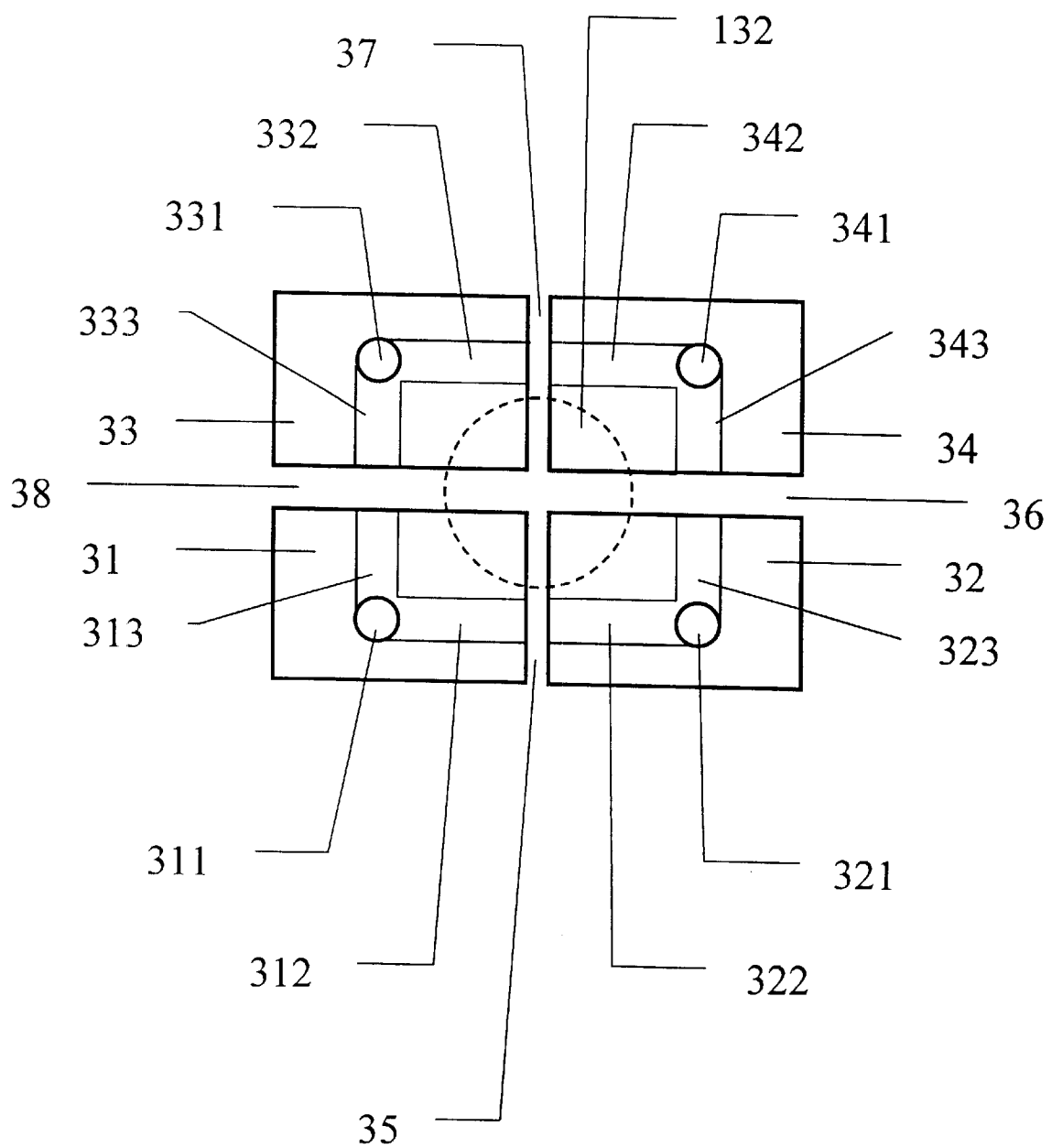
FIG. 9 shows fifth embodiment the bottom view of a four-terminal surface mount package.

FIG. 9 shows the bottom view of a fifth version of the structure. This structure is suitable for mounting a semiconductor device with four electrodes placed over the bottom 132 of the focusing cup. Here, there are four metallic contact plates 31, 32, 33, 34 connected to the four respective electrodes of the semiconductor device. Each contact plate has a through hole to reach the focusing cup on top and channels to strengthen the adhesion between the focusing cup and the metallic contact plate. Thus, the contact plate 31 has a through hole 311 and channels 312, 313; the contact plate 32 has a through hole 321 and channels 322, 323; the contact plate 33 has a through hoe 332 and channels 332, 333; the contact plate 34 has a through hole 341 and channels 342, 343.

While the preferred embodiments of this invention have described, it will be apparent to those skilled in the art that various modifications may be made in the embodiments without departing from the spirit of the present invention. Such modifications are all within the scope of this invention.

What is claimed is:

1. A surface mount semiconductor device package, comprising:

an optoelectric semiconductor device chip having at least a first electrode and a second electrode;

a plastic focusing cup for focusing the light emitted from said optoelectric semiconductor device chip;

at least a first metallic contact for surface mounting connected to said first electrode and a second metallic contact for surface mounting connected to said second electrode;

at least one through hole in each of said first metallic contact and said second metallic contact for the plastic material of said focusing cup to flow downward for attaching the focusing cup to said first metallic contact and to said second metallic contact, and at least one channel at the bottom of each of said metallic contact connected to each said through hole for the plastic material to spread, thereby strengthening the adhesion between the focusing cup and said first metallic contact and said second metallic contact.

2. A surface mount semiconductor device package as described in claim 1, wherein said optoelectric semiconductor device is a diode.

3. A surface mount semiconductor device package as described in claim 1, wherein said focusing cup has a flat bottom for said optoelectric semiconductor device to seat.

4. A surface mount semiconductor device package as described in the claim 2, wherein said first metallic plate and said second metallic plate are separated by a gap.

5. A surface mount semiconductor device package as described in the claim 1, wherein said semiconductor device chip has four bottom electrodes, and connected to four said metallic contact plates.

6. A surface mount semiconductor device package as described in claim 5, wherein each of said metallic contact plate has at least one channel at the bottom surface to spread the plastic material, thereby strengthening the adhesion between the focusing cup and each said metallic contact.

* * * * *